United States Patent
Tsai et al.

(10) Patent No.: US 7,265,438 B2
(45) Date of Patent: Sep. 4, 2007

(54) RF SEAL RING STRUCTURE

(75) Inventors: Chao Chieh Tsai, Hsin Chu (TW); Shyh-Ch Wong, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 28 days.

(21) Appl. No.: 11/180,470

(22) Filed: Jul. 13, 2005

(65) Prior Publication Data

US 2005/0248025 A1 Nov. 10, 2005

Related U.S. Application Data

(62) Division of application No. 09/989,837, filed on Nov. 20, 2001, now Pat. No. 6,943,063.

(51) Int. Cl.
*H01L 39/00* (2006.01)

(52) U.S. Cl. ................................. 257/662

(58) Field of Classification Search ........ 257/690–698, 257/724–728, 662, E23.127
See application file for complete search history.

(56) References Cited

U.S. PATENT DOCUMENTS

| 4,868,716 A | 9/1989 | Taylor et al. ............... 361/424 |
| 5,185,654 A | 2/1993 | Mosher et al. .............. 257/659 |
| 5,583,380 A | 12/1996 | Larsen et al. ............... 257/774 |
| 5,717,245 A | 2/1998 | Pedder ...................... 257/691 |
| 5,864,092 A | 1/1999 | Gore et al. ................. 174/52.4 |
| 5,998,245 A | 12/1999 | Yu ............................ 438/140 |
| 6,028,347 A | 2/2000 | Sauber et al. .............. 257/622 |
| 6,028,497 A | 2/2000 | Allen et al. ................ 333/246 |
| 6,105,226 A | 8/2000 | Gore et al. ................ 29/25.35 |
| 6,180,876 B1 | 1/2001 | Holmes ..................... 174/35 R |
| 6,212,077 B1 | 4/2001 | Brown et al. ............... 361/777 |
| 6,362,524 B1 | 3/2002 | Blish et al. ................ 257/734 |
| 6,545,348 B1 | 4/2003 | Takano ...................... 257/691 |
| 2003/0122235 A1* | 7/2003 | Tsai et al. .................. 257/678 |

* cited by examiner

*Primary Examiner*—Nathan W. Ha
(74) *Attorney, Agent, or Firm*—Thomas, Kayden, Horstemeyer & Risley

(57) ABSTRACT

Described is a method where a seal ring is formed by stacking interconnected conductive layers along the perimeter of an integrated circuit (IC). The seal ring is formed continuously around the IC perimeter using a conductive chain with two distinct widths. Each section of distinct width forms a transmission having a distinct characteristic impedance. Unwanted signals may be coupled to the seal ring from signal bond pads or from internal circuitry. Because of the impedance mismatch between the different width sections of the seal ring transmission lines, only a portion of each signal is propagated through each seal ring discontinuity while the remainder is reflected. As the signal passes through multiple discontinuities in the seal ring, it is further attenuated, reducing propagation of unwanted signals. This is accomplished while preventing moisture intrusion into the IC.

18 Claims, 2 Drawing Sheets

RF SEAL RING STRUCTURE

CROSS-REFERENCE TO RELATED APPLICATION

This application is a divisional of U.S. patent application Ser. No. 09/989,837, filed Nov. 20. 2001, now U.S. Pat. No. 6,943,063.

BACKGROUND OF THE INVENTION (1) Field of the Invention

The invention generally relates to an encapsulation process used in semiconductor manufacturing and, more particularly, to a method of encapsulation that improves isolation of radio frequency (RF) signals in the fabrication of integrated circuits.

(2) Description of Prior Art

As integrated circuit (IC) speeds increase, seal rings have been incorporated into the device encapsulation in order to reduce radio frequency (RF) interference and signal cross coupling. The seal ring is grounded or connected to a signal ground such as a DC voltage supply line to reduce interference. In some cases, the seal ring may be part of the device packaging scheme, where a conductive lid is typically connected to the seal ring. Specific to this invention, the seal ring may be incorporated into the IC fabrication and may include a conductive covering over the substrate.

FIG. 1 shows a top view of an IC die 20 where a seal ring 22 is incorporated. The seal ring 22 is typically composed of one or more interconnected layers of conductive metal. A plurality of bonding pads 24 are shown which may be either signal inputs or outputs, or DC voltage supply and ground. A portion of the circuit containing RF circuits 26 is shown. One problem with this method is that signals from the bonding pads 24 may be capacitively coupled to the seal ring 22. This may result in unwanted signal interference appearing at one of the signal input or output bonding pads 24. In addition, interference may be coupled between the seal ring 22 and the RF circuit 26 resulting in signal distortion.

One solution is to create breaks in the seal ring to prevent propagation of the signals in the seal ring. Unfortunately, this results in a problem when water is used for cooling in dicing the die from the wafer. Hydrogen and hydroxide ions attack the low K material in the seal ring breaks, resulting in contamination to the IC structure. For instance, fluorine in fluorinated silicate glass (FSG) will react with water to form hydrogen fluoride, which will erode metal. A second solution is to increase the distance from the seal ring to the bond pads and IC circuitry. This results in an increase in die area, thereby reducing device throughput.

Other approaches employing seal rings exist. U.S. Pat. No. 5,717,245 to Pedder teaches a system using a dielectric multi-layer substrate where RF interference is reduced by grounding certain areas and encapsulating the substrate within a conductive seal ring. U.S. Pat. No. 6,028,497 to Allen et al. teaches a system where RF signals are passed through a network of holes in the base plate of the module. The holes each consist of a conductive pin surrounded by, but electrically isolated from, a conductive cylindrical shroud, thereby forming a coaxial connection. A compartmentalized seal ring attached to the top of the module segregates different circuit areas of the module. U.S. Pat. Nos. 5,864,092 and 6,105,226 to Gore et al. teach methods employing a leadless chip carrier package where a grounded conductor protrudes between input and output signal pads thereby preventing interference. U.S. Pat. No. 5,998,245 to Yu teaches a method where ESD protection is incorporated into a seal ring structure on an IC die. U.S. Pat. No. 6,028,347 to Sauber et al. teaches a method where a portion of the seal ring is formed in trenches in the semiconductor surface. An encapsulating plastic covering over the surface fills the trenches thereby preventing movement of the cover and reducing stresses due to thermal expansion. U.S. Pat. No. 5,185,654 to Mosher et al. teaches a method using a circuit carrier to encapsulate a circuit while absorbing RF and hi-voltage electro static discharge (ESD) signals. U.S. Pat. No. 4,868,716 to Taylor et al. teaches a method using a pin grid assembly with a back plane to encapsulate circuit modules and prevent RF propagation between modules. U.S. Pat. No. 6,180,876 B1 to Holmes teaches a method using grounded conductive partitions on a circuit board to isolate different circuitry.

SUMMARY OF THE INVENTION

A principal object of the present invention is to provide a method that attenuates RF signals as those signals propagate through the seal ring in an integrated circuit.

Another object of the present invention is to provide a method that reduces cross coupling between circuits in an integrated circuit.

Another object of the present invention is to provide a method that prevents humidity intrusion in an integrated circuit.

Another object of the present invention is to provide a method that prevents low K material process issues due to water contamination.

Another object of the present invention is to provide a method that prevents stress propagation resulting from die sawing.

Another object of the present invention is to provide a seal ring device that attenuates RF signals as those signals propagate through the seal ring in an integrated circuit.

Another object of the present invention is to provide a seal ring device that reduces cross coupling between circuits in an integrated circuit.

These objects are achieved by using a method where a seal ring is formed by stacking interconnected metal layers along the perimeter of the integrated circuit (IC). The seal ring is formed using a chain with two distinct widths, each of which forms a transmission having a characteristic impedance. Because of the impedance mismatch between the sections of the seal ring transmission lines, only a portion of each RF signal is propagated through the seal ring discontinuity while the remainder is reflected. As the signal passes through multiple mismatches, it is further attenuated.

BRIEF DESCRIPTION OF THE DRAWINGS

In the accompanying drawings forming a material part of this description, there is shown.

DESCRIPTION OF THE PREFERRED EMBODIMENTS

The present invention uses a method where a seal ring having two distinct widths is formed along the perimeter of the integrated circuit (IC). One method of fabricating the seal ring is provided, however the important feature of the present invention is the two widths of the seal ring sections.

Figure 2:
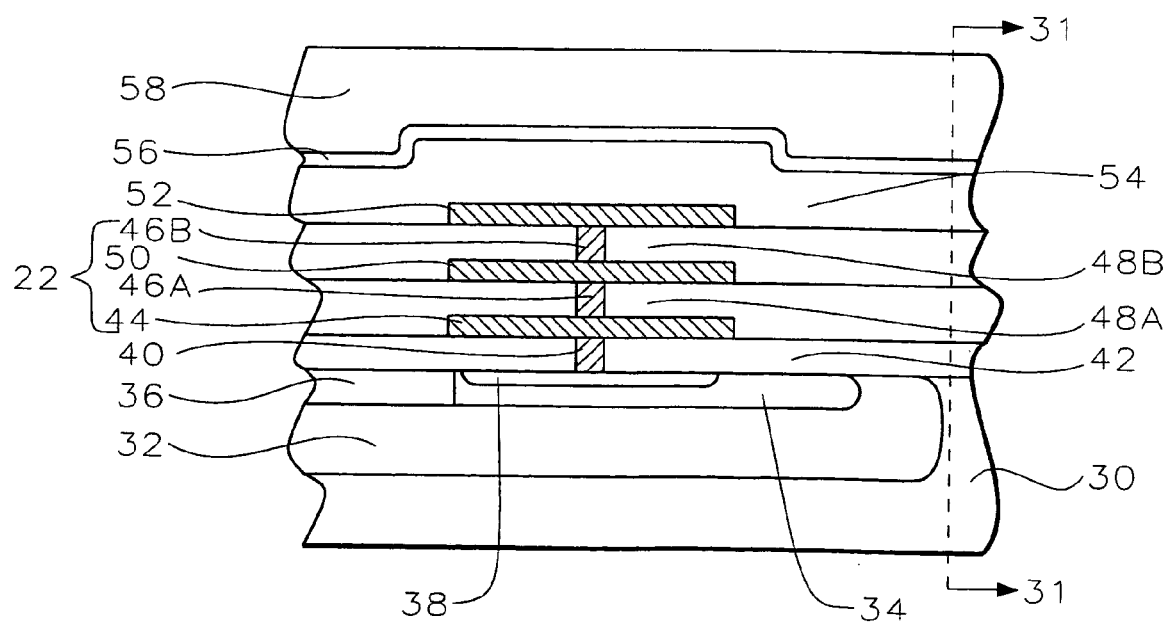
FIG. 2 schematically illustrating a cross-sectional representation of a method of forming a seal ring.

Refer to FIG. 2, depicting in cross-section a typical seal ring 22 structure. A substrate 30 is provided. The substrate layer 30 in an active area may contain underlying layers, devices, junctions, and other structures (not shown) formed during process steps. The cut line 31 represents the perimeter of the IC die of interest. During subsequent processing, the die will be separated along cut line 31 from an adjacent IC die (not shown) sharing the substrate 30. A deep N-well region 32 is formed as is conventional in the art. A p+ source/drain (S/D) region 34 is isolated from the remainder of the underlying circuitry (not shown) by shallow trench isolation 36. A silicide 38 is formed over the S/D region 34 providing a low resistance connection to the S/D region 34. Contacts 40 through first interlevel dielectric layer 42 make electrical connection to the first conductive layer 44. Via layers 46a and 46b through dielectric layers 48a and 48b, respectively, make electrical contact to conductive layers 44 and 50, respectively. A top conductive layer 52 is then provided. This is followed by a passivation layer 54 composed of USG oxide, for example. The seal ring 22 is composed of the conductive layers 44, 50 and 52 and via layers 46a and 46b. The combination of conductive layers 44, 50, and 52, oxide layers 48 and vias 46 may be fabricated using a multi-step damascene process, for example. The seal ring 22 makes electrical contact to the deep N-well 32 via contact 40, silicide 38 and S/D region 24. A nitride layer 56 is then conformally deposited over the passivation layer 54 and thereafter a polyimide layer 58 is deposited over the nitride layer. It will be understood by those skilled in the art that the number of conductive layers (three layers used in this example) is not critical to the invention. It may correspond to the number of conductive layers used in the device process and may be increased or decreased as necessary.

When the completed IC is connected in a circuit, the deep N-well 32 is electrically connected to a positive supply voltage ($V_{dd}$) thereby holding the deep N-well 32 and seal ring 22 at signal ground. This minimizes signal coupling within the substrate 30 and the S/D region 34.

Figure 1:
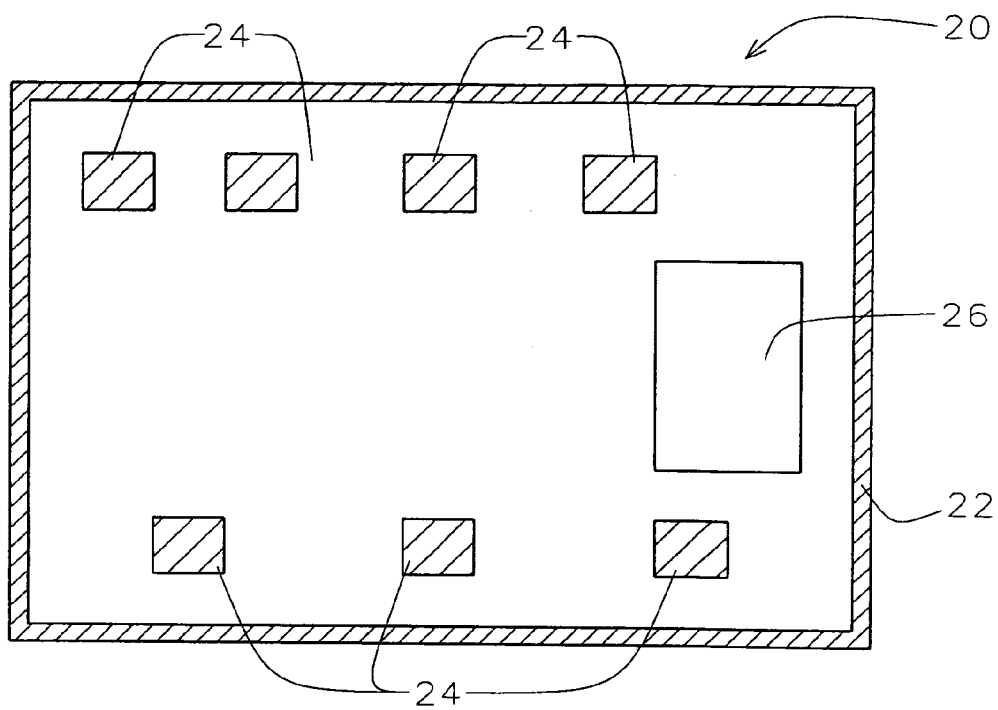
FIG. 1 schematically illustrating a top view cross-sectional representation of a prior art example employing seal rings.
Figure 3:
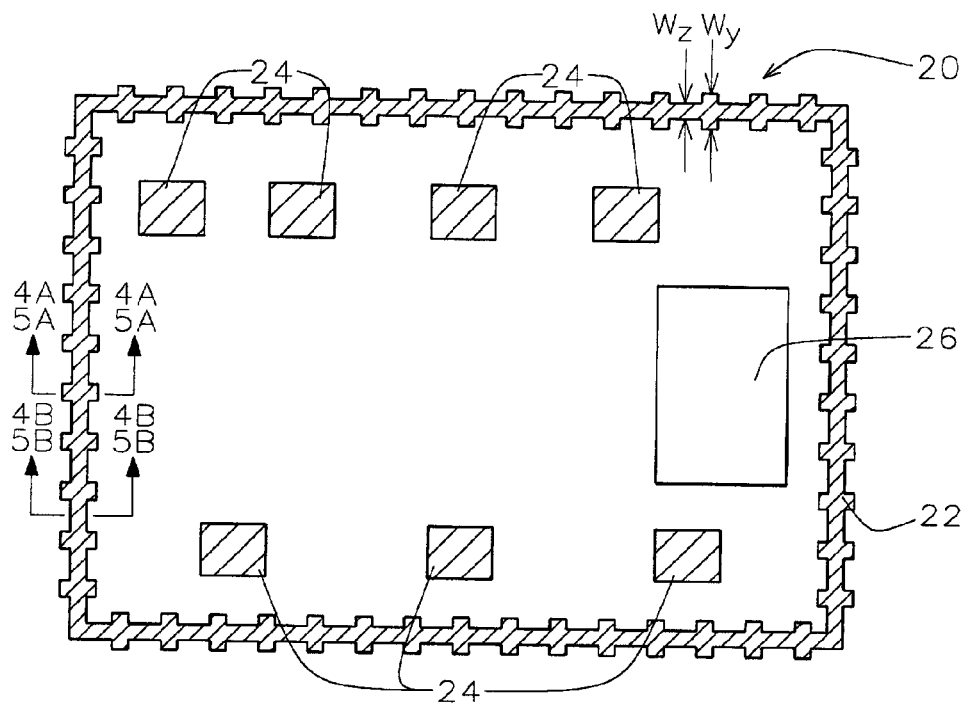
FIG. 3 schematically illustrating a top view of an embodiment of the present invention.

Refer now to FIG. 3 showing a top view of an integrated circuit 20 and seal ring 22, depicting an important point of the present invention. Similar to the prior art of FIG. 1, a plurality of bonding pads 24 are shown which may be either signal inputs or outputs, or DC voltage supply and ground. The bonding pads 24 are shown in typical positions near the outer edge of the IC die 20 and contained within the seal ring 22. A portion of the circuit containing RF circuits 26 is also depicted in a typical position within the seal ring 22. The seal ring 22 is placed along the perimeter of the IC die 20 and has two distinct widths ($W_y$ and $W_z$). Typical widths of the wider section ($W_y$) of the seal ring 22 would be between about 1 µm and 55 µm, while typical widths of the narrower seal ring 22 sections ($W_z$) would be between about 0.5 µm and 50 µm. Propagation of unwanted signals within the improved seal ring 22 is prevented using a method based upon transmission line theory. Each distinct section of seal ring 22 has a characteristic impedance. The wider sections have a characteristic impedance $Z_y$ and the narrower sections have a different characteristic impedance $Z_z$. As a signal propagates through the seal ring 22, it encounters the discontinuities in width. Each discontinuity has a reflection coefficient (Γ) given by:

$$\Gamma = (Z_z - Z_y)/(Z_z + Z_y).$$

A fraction of the signal (Γ) is reflected at each discontinuity and the remainder (1−Γ) is passed to the next seal ring section. After N discontinuities the signal is attenuated by a factor of $(1-\Gamma)^N$. If, for example, Γ=0.2, after 31 discontinuities the signal would be approximately 0.1% of the original signal and therefore is virtually eliminated. The desired length of each transmission line would preferably be ¼ wavelength of the frequency of the interference. It would also be possible to use more than two widths of transmission line to create different impedances in each section.

Figures 4A, 4B:
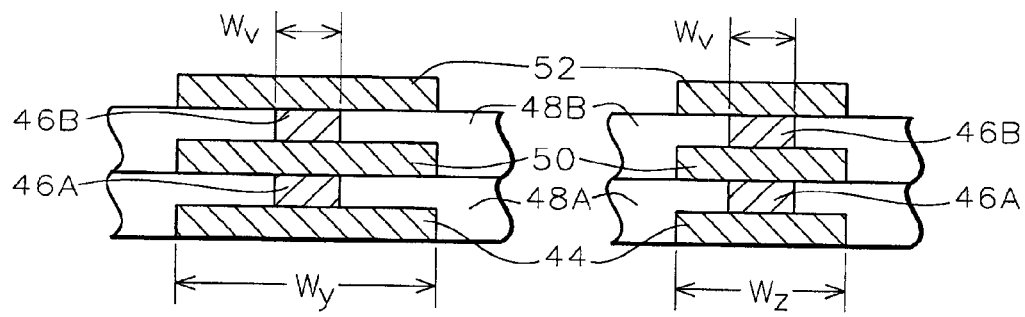
FIGS. 4a and 4b schematically illustrating in cross-sectional representation one embodiment of the present invention.

Refer to FIG. 4, depicting in cross-section one embodiment of the seal ring conductive layers described in FIGS. 2 and 3. Shown in both FIGS. 4a and 4b are a plurality of conductive layers 44, 50, and 52 separated by oxide layers 48a and 48b. The conductive layers 44, 50, and 52 are electrically connected by vias 46a and 46b. The conductive layers 44, 50, and 52 in FIG. 4a have width $W_y$, while the conductive layers 44, 50, and 52 in FIG. 4b have width $W_z$. The vias 46a and 46b have the same width $W_v$ between about 0.1 µm and 1 µm.

Figures 5A, 5B:
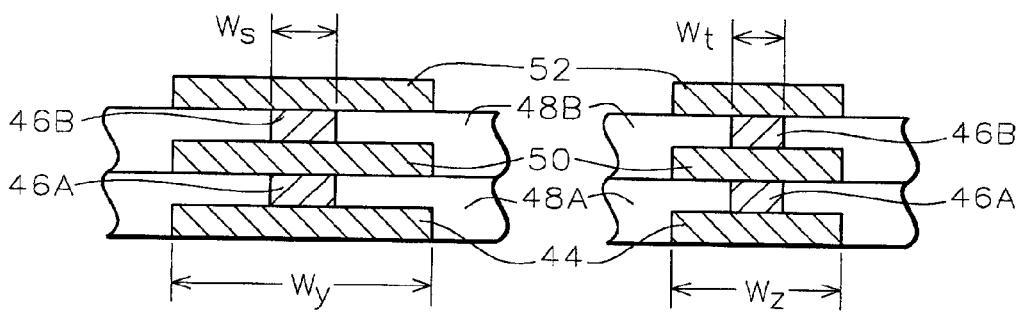
FIGS. 5a and 5b schematically illustrating in cross-sectional representation a second embodiment of the present invention.

Refer to FIG. 5, depicting in cross-section a second embodiment of the seal ring This seal ring contact to the substrate is also similar in fabrication to the one described previously in FIG. 2 and is therefore omitted. Shown in both FIGS. 5a and 5b are a plurality of conductive layers 44, 50, and 52 separated by oxide layers 48a and 48b. The conductive layers 44, 50, and 52 are electrically connected by vias 46a and 46b. The conductive layers 44, 50, and 52 in FIG. 5a have width $W_y$, while the conductive layers 44, 50, and 52 in FIG. 5b have width $W_z$. The vias 46 in this embodiment shown in FIG. 5a and FIG. 5b have different widths $W_s$ and $W_t$, respectively. $W_s$ is between about 1 µm and 4 µm, and $W_t$ is between about 0.1 µm and 2 µm.

The present invention is achieved by using a method where a seal ring is formed by stacking interconnected conductive layers along the perimeter of the integrated circuit (IC). The seal ring is formed continuously around the IC perimeter using a conductive chain with two distinct widths. Each section of distinct width forms a transmission having a distinct characteristic impedance. Unwanted signals may be capacitively coupled to the seal ring from bond pads or from internal circuitry. Because of the impedance mismatch between the different width sections of the seal ring transmission lines, only a portion of each signal is propagated past each seal ring discontinuity while the remainder is reflected. As the signal passes through multiple discontinuities, it is further attenuated, reducing propagation of signals through the seal ring while maintaining a moisture barrier for the IC.

While the invention has been particularly shown and described with reference to the preferred embodiments thereof, it will be understood by those skilled in the art that various changes in form and details may be made without departing from the spirit and scope of the invention.

What is claimed is:

1. A seal ring surrounding the perimeter of an integrated circuit comprising at least two different and alternating conductive transmission line sections and defining a conductive path having a plurality of sections, the sections having at least two different alternating widths as measured across the conductive path, and at least one section having a characteristic impedance different with that of its adjacent section.

2. The seal ring according to claim 1, wherein said different and alternating transmission line sections comprise a plurality of stacked, interconnected, and conductive layers.

3. The seal ring according to claim 1 wherein the width of the narrowest of said different and alternating transmission line sections is between about 0.5 and 50 μm.

4. The seal ring according to claim 1 wherein the width of the widest of said different and alternating transmission line sections is between about 1 and 55 μm.

5. The seal ring according to claim 1 whereby the characteristic impedance of each of said different and alternating transmission line sections is different.

6. The seal ring according to claim 1, wherein said different and alternating transmission line sections are fabricated by forming a plurality of stacked, interconnected, and conductive layers, each of which is formed by steps comprising:
depositing an inter-metal dielectric layer;
etching openings through said inter-metal dielectric layer;
filling said openings with a conductive via layer; and
depositing and patterning a conductive metal layer to make contact to said conductive via layer filling said openings in said inter-metal dielectric layer, wherein a first of said conductive via layers makes electrical contact to signal ground points within a substrate of an active area, and wherein each of subsequent said conductive via layers makes electrical contact to previous patterned said conductive metal layer, completing said integrated circuit seal ring.

7. The seal ring according to claim 6 wherein the width of said conductive metal layers of the narrowest of said different and alternating transmission line sections is between about 0.5 and 50 μm.

8. The seal ring according to claim 6 wherein the width of said conductive metal layers of the widest of said different and alternating transmission line sections is between about 1 and 55 μm.

9. The seal ring according to claim 6 wherein the width of said via layers of the narrowest of said different and alternating transmission line sections is between about 0.5 and 50 μm.

10. The seal ring according to claim 6 wherein the width of said via layers of the widest of said different and alternating transmission line sections is between about 1 and 55 μm.

11. The seal ring according to claim 1, wherein each of the sections has a different width from its adjacent sections.

12. The seal ring according to claim 1, wherein the characteristic impedance of each of the different and alternating transmission line sections is different.

13. The seal ring according to claim 6, wherein the active area comprises a plurality of semiconductor device structures.

14. A seal ring, comprising at least two different and alternating conductive transmission line sections forming a continuous conductive loop around the perimeter of an integrated circuit, the conductive loop defining a conductive path having a plurality of sections, the sections having at least two different alternating widths as measured across the conductive path, each sections having a different characteristic impedance.

15. The seal ring according to claim 14, wherein the different and alternating transmission line sections comprise a plurality of stacked, interconnected, and conductive layers.

16. The seal ring according to claim 14, wherein each of the sections has a different width from its adjacent sections.

17. The seal ring according to claim 16, wherein characteristic impedance of each of the two different widths is different.

18. The seal ring according to claim 14, wherein the characteristic impedance of each of the different and alternating transmission line sections is different.

* * * * *